United States Patent
Elata (10) Patent No.: US 10,957,843 B2
(45) Date of Patent: Mar. 23, 2021

(54) PIEZOELECTRIC DEVICES WITH OBLIQUELY ALIGNED ELECTRODES

(71) Applicant: TECHNION RESEARCH AND DEVELOPMENT FOUNDATION LIMITED, Haifa (IL)

(72) Inventor: David Elata, Haifa (IL)

(73) Assignee: TECHNION RESEARCH AND DEVELOPMENT FOUNDATION LIMITED, Haifa (IL)

( * ) Notice: Subject to any disclaimer, the term of this patent is extended or adjusted under 35 U.S.C. 154(b) by 0 days.

(21) Appl. No.: 16/323,583

(22) PCT Filed: Aug. 10, 2017

(86) PCT No.: PCT/IL2017/050892
§ 371 (c)(1),
(2) Date: Feb. 6, 2019

(87) PCT Pub. No.: WO2018/029695
PCT Pub. Date: Feb. 15, 2018

(65) Prior Publication Data
US 2019/0189897 A1 Jun. 20, 2019

Related U.S. Application Data

(60) Provisional application No. 62/372,837, filed on Aug. 10, 2016, provisional application No. 62/372,842, filed on Aug. 10, 2016.

(51) Int. Cl.
*H01L 29/82* (2006.01)
*H01L 41/09* (2006.01)
(Continued)

(52) U.S. Cl.
CPC .......... *H01L 41/096* (2013.01); *B81B 3/0024* (2013.01); *H01L 41/047* (2013.01); *H01L 41/094* (2013.01); *H01L 41/0993* (2013.01)

(58) Field of Classification Search
CPC ... H01L 41/096; H01L 41/047; H01L 41/094; H01L 41/0993; B81B 3/0024
See application file for complete search history.

(56) References Cited

U.S. PATENT DOCUMENTS

2003/0056351 A1* 3/2003 Wilkie ................ H01L 41/0986
29/25.35
2006/0016055 A1 1/2006 Wilkie et al.

FOREIGN PATENT DOCUMENTS

WO 2010010502 A1 1/2010

OTHER PUBLICATIONS

International Search Report for PCT/IL20017/050892, dated Nov. 19, 2017, 4 pages.
(Continued)

*Primary Examiner* — Samuel A Gebremariam
(74) *Attorney, Agent, or Firm* — Roach Brown McCarthy & Gruber, P.C.; Kevin D. McCarthy (57) ABSTRACT

Single bulk unimorph piezoelectric elements, with interdigitated electrodes aligned obliquely relative to the direction perpendicular to the axis of the element, such that a torsional response is induced into the element. When such elements are used as a beam structure, with angularly oriented electrodes on both opposite surfaces of the beam, and with their orientations at mutually opposite angles, motion ranging from pure torsional rotation to pure bending can be obtained, depending on the comparative level and polarity of the voltages applied to each of the two electrode sets. If such elements are used as the spiral support arms of a central platform, a large displacement of the stage can be achieved. Due to the oblique orientation of the IDE's, the piezoelectric transduction induces torsional deformation in the spirals, and this torsion is converted by the spiral arms to a parallel out-of-plane platform motion.

19 Claims, 6 Drawing Sheets

(51) Int. Cl.
*H01L 41/047* (2006.01)
*B81B 3/00* (2006.01)

(56) References Cited

OTHER PUBLICATIONS

Written Opinion of the International Searching Authority for PCT/IL2017/050892, dated Nov. 19, 2017, 4 pages.

* cited by examiner

PIEZOELECTRIC DEVICES WITH OBLIQUELY ALIGNED ELECTRODES

FIELD OF THE INVENTION

The present invention relates to the field of bimorph piezoelectric actuators, especially those having obliquely aligned interdigitated electrodes on their surfaces, resulting in novel motion modes which are usually only attainable with more complex structures.

BACKGROUND

There exist many mechanical designs of piezoelectric unimorph actuators that can generate various motions other than conventional in-plane motions. Such devices are used to generate deflections or bending, twisting or torsional motion, and parallel out-of-plane motion, for use in micro-electromechanical systems (MEMS).

Tilting motion, which is crucial for micro-mirror actuation, has been achieved using the bending response of bimorph piezoelectric actuators. A number of publications have described such micro-mirror actuators, including "A two-axis piezoelectric tilting micro-mirror with a newly developed PZT-meandering actuator," by M. Tani et al., published in Proceedings of IEEE 20th. International Conference on MEMS, pp. 699-702 (2007); "Tip-tilt-piston piezoelectric micro-mirror with folded PZT unimorph actuators," by W. Liao et al., published in IEEE-NEMS Suzhou Proceedings, pp. 969-972, (2013); "Fabrication and characterization of a piezoelectric micro-mirror using for optical data tracking of high-density storage," by Q. L. Zhao, et al, published in Microsystem Technologies, 20, 1317-1322, (2014); and "Design, fabrication and characterization of piezoelectrically actuated gimbal-mounted 2D micro-mirrors," by S. Gu-Stoppel et al., published in IEEE-Transducers, pp. 851-854, (2015). In such devices, bending deformation has to be converted into angular motion, because piezoelectric beams could not be directly driven in torsion mode. This makes those devices complex and requires a comparatively large area of the MEMS for implementation.

The provision of bending motion, such as is required for mechanical generation of torsion in the above described devices, has recently been simplified by the devices described in the article titled "Transverse Interdigitated Electrode Actuation of Homogeneous Bulk PZT" by P. Hareesh, et al, published in IEEE-JMEMS, 21, pages 1513-1518, (2012). In that article, a simple structure is shown, illustrating that a bending response can be also achieved in a bulk, unimorph, piezoelectric beam, which can replace the bending actuators used in the above referenced Zhao article. The device in Zhao et al must be sufficiently large so that the bending beams are sufficiently long as to produce the required edge motions. However, a mechanical arrangement for conversion of that bending motion into the desired torsion motion is still required.

Furthermore, parallel out-of-plane motion is also required for many applications including micro-mirrors, infrared sensors, laser beam steering and more. Such motion has been previously achieved by inducing bending in bimorph piezoelectric actuators, such as is shown in the above-referenced article by W. Liao et al, and in the above-referenced article by Q. L. Zhao et al. Both have complex structures, and occupy a large area on the substrate.

There therefore exists a need for simple, small area piezoelectric devices which overcomes at least some of the disadvantages of prior art systems and methods, and can provide at least one of torsional motion, bending motion and parallel out-of-plane motion, such as for use in micro-mirror actuators.

The disclosures of each of the publications mentioned in this section and in other sections of the specification, are hereby incorporated by reference, each in its entirety.

SUMMARY

The present disclosure describes new exemplary piezoelectric devices for providing motions which can variously be described as deflection, bending, twisting, torsional and parallel out-of-plane motions, for use in micro-electromechanical systems (MEMS), and particularly as micro-mirror actuators, where high speed motions of these types are required.

Conventional bulk, unimorph, piezoelectric elements are generally actuated by interdigitated electrodes (IDE's) disposed in a direction perpendicular to the longitudinal axis of the actuated element. Thus, in the above referenced article by Hareesh et al, bulk unimorph actuators, which did not require a substrate, and enable transduction of a very deep layer of piezoelectric material, use conventional IDE's disposed in a direction perpendicular to the beam axis, resulting in beam bending only.

Similarly, in the article by G. J. Xiao et al, entitled "In-plane torsion of discal piezoelectric actuators with spiral interdigitated electrodes" published in Sensors and Actuators, Vol. A227, pp. 1-10 (2015), there are described piezoceramic discs with helical interdigitated electrode structures on their surfaces, which are used to apply in-plane torsional forces to the central circular element, which thus rotates. The spirally shaped electrodes can have either a constant electrode spiral angle, or have a constant pitch between adjacent electrodes. The voltages, both for poling and for operation of the device, are applied between adjacent spirally shaped electrodes. Beyond the small torsional rotation enabled by these devices, no other motions are described.

Prior art devices generally have the IDE's oriented with the finger electrodes perpendicular to the axis of the element to which the desired motion is to be applied. The presently described devices differ from those of the prior art in that the IDE's are orientated obliquely to the normal to the axis of the element being driven, in the case of a beam, this axis being defined as the longitudinal axis along the length of the beam. In the case of a spiral element, this axis is defined as the centerline running along the curved length of the spiral geometry. The obliquely aligned angle is generally 45° to provide symmetry in operation of the device and to provide the maximum desired motion effect. Use of such obliquely aligned IDE's enables the provision of devices providing motions which cannot generally be provided so simply in prior art devices having conventionally aligned IDE's perpendicular to the axis of the element being driven. The term "oblique" or "obliquely" or similar terms, are to be understood throughout this application, and are also thuswise claimed, as being at an angle substantially divergent from the normal to the axis of the driven element, which is the alignment angle of the IDE's in the prior art.

For the case of a bulk PZT unimorph beam, the use of obliquely aligned IDE's enables the generation of torsional motion in the beam, in contrast to the prior art IDE orientation, where only bending motion is obtained. However, this novel obliquely aligned IDE configuration combines a bending motion with the generated torsional motion.

On the other hand, if the beam actuator is constructed with oppositely disposed IDE's on both its top and bottom surfaces, and the orientation of these electrodes is optimized to induce maximal shear stresses, such as by the above mentioned orientation at 45° to the beam axis, then further novel motion applications can be provided by these devices. If the shear stress at the top and bottom of the beam are in opposite directions, a pure torsion deformation (i.e. twisting) is induced along the beam, without the accompanying bending motion which was obtained with an obliquely aligned IDE on one surface only. On the other hand, if these shear stresses are induced in the same direction, then a pure bending deformation is induced. These configurations then enable the actuator to be driven in either pure torsion or in pure bending modes, with negligible cross-coupling between the two motions. Selection of the appropriate applied voltages enables attainment of any combination of motion, between that of pure torsion and that of pure bending.

The case of the spirally supported platform may be considered as a particular extension of the rectilinear beam implementations described above. If the axis of the spiral is compared with the axis of the longitudinal beam, then the prior art application of IDE's in a direction perpendicular to the curved axis line along the center of the spiral arms, as is conventional in the prior art for IDE's intended to generate motion in an element, results in bending deformation along the curved axis of the spiral arms. However, such bending deformation is small and enables only very limited out-of-plane motion for the central stage. Even if the spiral arms were constructed of bimorphs, the situation would not have been significantly improved.

However, if, as in the above described case of the rectilinear beam, the IDE's are oriented obliquely relative to the axis running along the length of the spirals, this orientation induces torsion in the spiral arms. Application of torsion results in a substantially larger out-of-plane motion of the central stage, than is obtained by application of just bending, and the result is a useful out-of-plane motion of the central stage. This result shows the surprisingly substantial advantage of torsional deformation over bending deformation for this implementation of obliquely applied IDE's.

Though a 45° orientation of the IDE's to the element axis is generally chosen as the oblique angle, this angle providing the maximum effect of the motion phenomenon being used, it is to be understood that this angle is not unique, and that a desired motion is also generated, but at a lesser level, by other angled orientation of the IDE's.

There is thus provided, in accordance with an exemplary implementation of the devices described in this disclosure, a planar device for generating motion, comprising at least one piezoelectric element having an interdigitated electrode structure having interleaved fingers formed on each of its two opposite surfaces, each of the interdigitated electrode structures having its interleaved fingers aligned obliquely to the perpendicular to the axis along the length of the at least one element, wherein the interleaved fingers of the interdigitated electrodes on the two opposite surfaces are oriented at mutually opposite angles relative to the axis along the length of the at least one element.

In such a planar device, the at least one piezoelectric element may be a beam, and the axis is then the longitudinal axis along the length of the beam. In such a case, application of driving voltages to the interdigitated electrodes on the two opposite surfaces may generate beam motion ranging from a substantially pure torsional motion to a substantially pure bending motion, depending on the level and direction of voltages applied to the interdigitated electrodes. According to one implementation, application to the interdigitated electrodes on the two opposite surfaces, of voltages of the same level and polarity, causes the beam to undergo a substantially pure torsional motion. According to another implementation, application of voltages of the same level but of opposite polarity to the interdigitated electrodes on the two opposite surfaces, causes the beam to undergo a substantially pure bending motion. According to yet another implementation, application of voltages different levels to the interdigitated electrodes on the two opposite surfaces, causes the beam to undergo a combination of torsional and bending motion.

In yet further implementations, the at least one piezoelectric element may be spiral shaped elements, and the axis is then considered to be the curved axis along a centerline of the spiral shaped piezoelectric elements. In such a case, the device may comprise a plurality of spiral shaped piezoelectric elements, each attached to and radiating out from a central platform.

In any of the above described devices, oblique alignment of the interleaved fingers to the perpendicular to the axis along the length of the at least one element, is an alignment at approximately 45°.

There is further provided according to another implementations of the devices described in this application, a planar device for generating out-of-plane motion, comprising:

(i) a piezoelectric substrate comprising a central region and an outer region, (ii) a plurality of spiral shaped arms connecting the central region to the outer region of the substrate, and (iii) a pattern of interdigitated finger electrodes formed on at least one surface of each the spiral shaped arms, the interdigitated finger electrodes being generally aligned at an angle substantially distinct from the perpendicular to the axis along the length of the spiral shaped arms.

In such a device, the substrate may be sufficiently thin that the central region can move out of the plane of the substrate when a voltage is applied to the pattern of interdigitated finger electrodes. Furthermore, the patterns of interdigitated finger electrodes may be formed on one surface of the spiral shaped arms, or on both surfaces of the spiral shaped arms.

In addition, according to yet a further implementation, the patterns of interdigitated finger electrodes on all of the spiral shaped arms may be energized with the same voltage, such that the central region of the substrate moves in an out-of-plane motion parallel to the plane of the substrate. Alternatively, the patterns of interdigitated finger electrodes on at least one of the spiral shaped arms may be energized with a voltage different from that on any other pattern of interdigitated finger electrodes, such that the central region of the substrate moves in an out-of-plane motion tilted relative to the plane of the substrate. In any of the above described planar devices, the angle distinct from the perpendicular to the axis along the length of the spiral arms is essentially 45°. Furthermore, in any of those implementations, the spiral shaped arms may be formed by spiral shaped slits extending from spaced-apart positions on the perimeter of the central region to the outer region of the piezoelectric substrate.

Finally, according to yet another implementation of the devices of the present application, there is provided a planar device for generating a combination of torsional and bending motion in a beam, the device comprising a piezoelectric beam having an interdigitated electrode structure with interleaved finger electrodes formed on at least one surface of the beam, the structure having its interleaved fingers aligned at an angle substantially divergent from the normal to the centerline along the length of the beam. In such a device, the angle may be approximately 45°.

BRIEF DESCRIPTION OF THE DRAWINGS

The present invention will be understood and appreciated more fully from the following detailed description, taken in conjunction with the drawings in which.

DETAILED DESCRIPTION

Figure 1A:
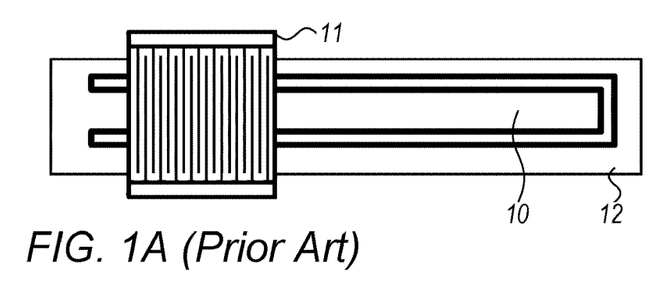
FIGS. 1A to 1C show different representations of a prior art exemplary device comprising a long unimorph beam, driven by IDE's disposed according to the prior art, at 90° to the beam axis.
Figure 1B:
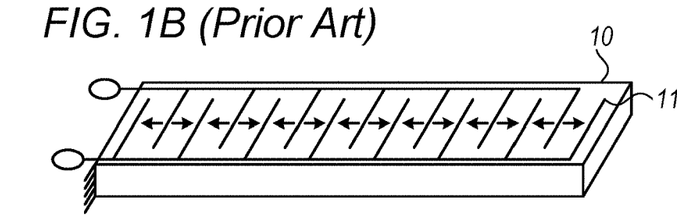
Figure 1C:
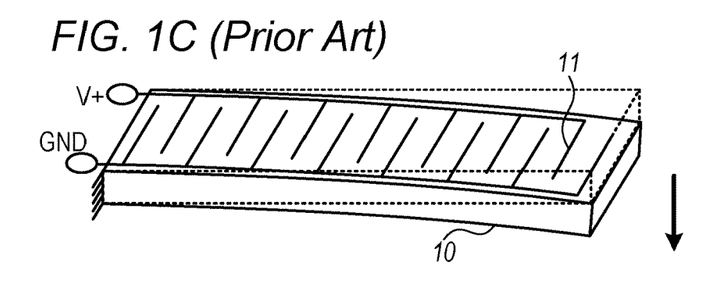

Reference is first made to FIGS. 1A to 1C, which are schematic representations of an exemplary prior art device comprising a 10 mm long bulk unimorph beam 10 cut from a larger, plate 12 of piezoelectric material. The IDE's are disposed according to the prior art, at 90° to the beam axis. FIG. 1A shows a representation of a micro-photograph of the beam 10, showing a close-up insert of the IDE structure 11 deposited on the top surface of the beam. The polarization, as conventionally performed, is set up in the direction between the electrodes of the IDE. FIG. 1B is a schematic view of the structure in the load-free or voltage free configuration, and no bending is shown. In FIG. 1C, an energizing voltage V is applied to the IDE's, resulting in a bending deflection of the beam, as indicated by the arrow at the right hand side of the beam.

Figure 2A:
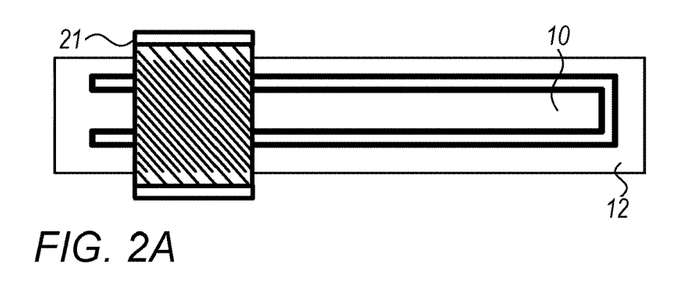
FIGS. 2A to 2C illustrate an exemplary bulk unimorph piezoelectric beam, similar to that shown in the prior art FIGS. 1A to 1C, but having the IDE's aligned obliquely to the length axis of the beam.
Figure 2B:
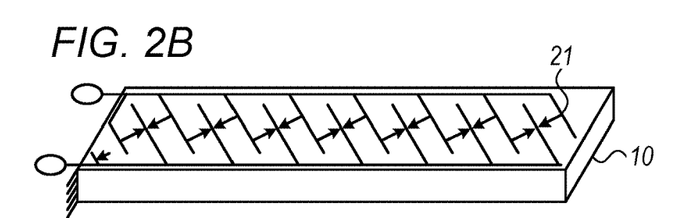
Figure 2C:
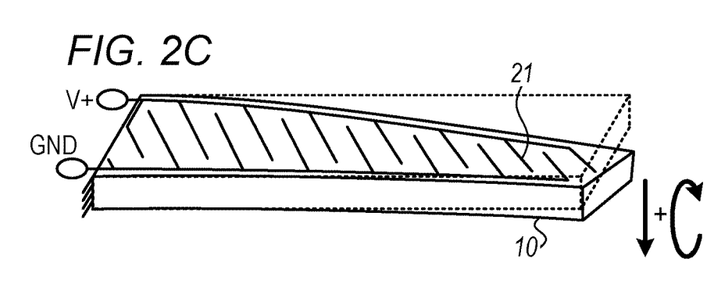

Reference is now made to FIGS. 2A to 2C, which illustrates an exemplary bulk unimorph piezoelectric beam 10, cut from a 127 µm thick lead zirconate titanate (PZT) plate 12, similar to that shown in the prior art FIGS. 1A to 1C, but having the IDE's 21 aligned at a 45° angle to the length axis of the beam. The gold IDE electrodes for driving the beam, are deposited on the beam using a single lift-off process The IDE finger width and spacing are both 20 µm wide. A thick resist-tape and sand-blasting process may be used to micromachine the cantilever beams. The same three types of views of the device as those of FIGS. 1A to 1C, are shown in FIGS. 2A to 2C. As is observed in FIG. 2B, the poling has generated the polarization of the PZT material to line up in a direction between the IDE's 21. In the novel configuration of FIG. 2C, application of the energizing voltages to the IDE's results in a torsional motion combined with the bending motion of the beam, as indicated respectively by the combination of the straight arrow and the circularly directed arrow at the right hand side of the beam.

The dimensions and material of the exemplary beam of FIGS. 1 and 2 are used throughout this disclosure to illustrate the comparative performances of the various beam implementations. The exemplary beam is cut from a 127 µm thick PZT plate, 10 mm. in length, and 1,000 µm wide, with the IDE array width between voltage application conductors being 900 µm.

Figure 3:
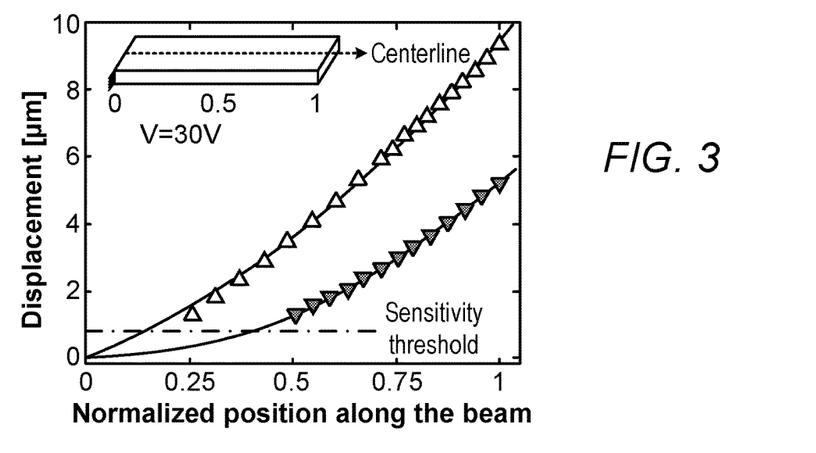
FIG. 3 shows graphs of the out-of-plane displacements of the beams of FIGS. 1A to 1C compared with that of FIGS. 2A to 2C along the beam centerline, as a function of the normalized position along the beam.
Figure 4:
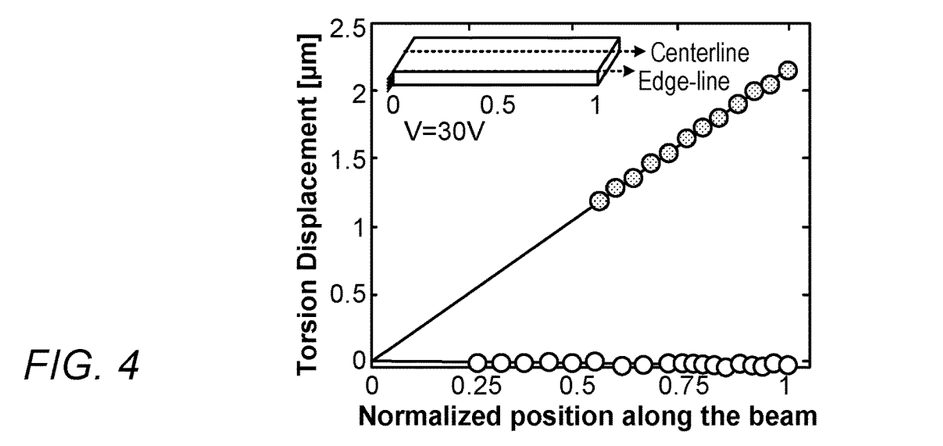
FIG. 4 shows graphs of the torsional displacement of the beams of FIGS. 1A to 1C compared with that of FIGS. 2A to 2C along the beam centerline, as a function of the normalized position along the beam.
Figure 5:
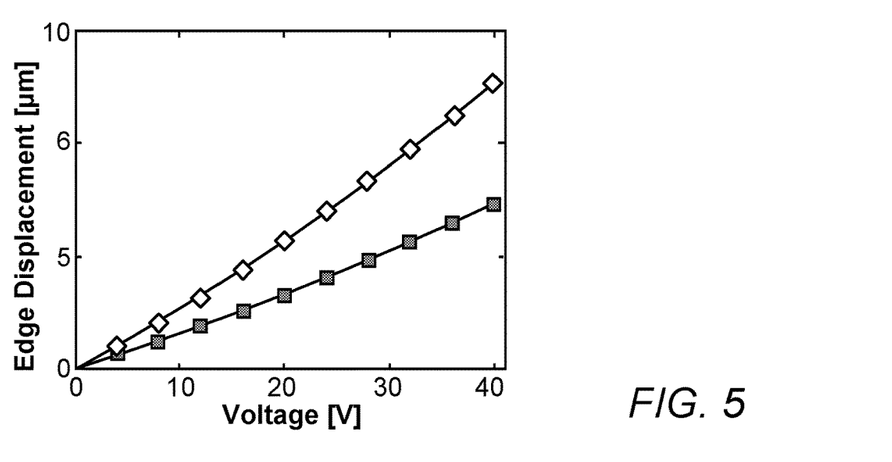
FIG. 5 shows graphs showing the centerline-edge displacements, for both the prior art beams of FIGS. 1A to 1C, and for the present described beams of FIGS. 2A to 2C, as a function of applied energizing voltage V.

To illustrate the effectiveness of these novel configurations, the properties of the beam were measured while the electrodes were being driven by a constant DC offset of 50V, and a slow (10 Hz) AC voltage signal, with amplitudes of up to Vac=50V. FIGS. 3 to 5 show graphs of the resulting motions.

Reference is first made to FIG. 3 which shows graphs of the out-of-plane displacements of the beam along the beam centerline, as a function of the normalized position along the beam, at a constant applied voltage of 30V. In the graphs of FIG. 3, the displacement is shown both for the prior art device shown in FIGS. 1A to 1C, and for the exemplary device of the present disclosure, as shown in FIGS. 2A to 2C. For both the prior art beam with its IDE's at 90° to the beam axis, as shown by the hollow triangles, and for the novel 45° configuration of the present application, as shown by the shaded triangles, the bending profile is nearly parabolic, as expected for beams driven by internal moment, except for the vicinity of the clamped edge. As expected from geometrical considerations, the displacement of the prior art 90° IDE configuration is approximately twice that of the present 45° IDE configuration beam.

Reference is now made to FIG. 4, which shows graphs of the torsional displacement respectively of the prior art beam and the beam of the current configuration, as a function of the normalized position along the beam length. The torsion profile is derived by simply subtracting the displacements along the centerline from those measured along the edgeline, as shown in the insert drawing. The beam constructed according to the present disclosure with IDE's at 45°, as shown by the shaded circles, has a good linear torsion profile with $R^2=0.9978$. In contrast, the prior art beam with its IDE's at 90°, as shown by the hollow circles, shows negligible torsion. FIG. 4 thus clearly illustrates the surprisingly substantial advantages of the 45° aligned IDE configuration of the present application. It should be emphasized that although the 45° orientation of the IDE's is chosen to provide the maximum torsional motion of the beam, it is to be understood that this angle is not unique, and that torsional motion is also generated by other angled orientations of the IDE's.

Reference is now made to FIG. 5, which are graphs showing the centerline-edge displacements, for both the prior art beam of FIGS. 1A to 1C, and for the present described beam of FIGS. 2A to 2C, as a function of applied energizing voltage V. For both of the beams, the displacement increases monotonically with voltage, but the response is not necessarily linear. As expected, the bending of the prior art 90° orientated IDE beam, as shown by the hollow squares, is approximately twice that of the novel 45° orientated IDE beam, as shown by the shaded squares.

The novel 45° IDE configuration described in FIGS. 2A to 2C combines bending motion with the generated torsional motion. Since, as will be shown in FIG. 10 below, the torsional resonance frequency is generally much higher than the bending mode resonance frequency—more than an order of magnitude higher in the example shown in FIG. 10—in applications where one or other of the responses can be preferentially excited, this mixture of bending and twisting motions may not necessarily be detrimental. For example, a mirror scanning system that operates at a high torsional mode frequency may not be affected by any bending of the beam having a substantially lower resonant frequency, since such low frequency vibrations will have a completely negligible amplitude when excited at the high torsional resonance frequency. Therefore, there will be applications in which the one sided configurations of FIGS. 2A to 2C will, for instance, be a useful solution for providing controlled torsional motion at the resonant torsional vibrational frequency.

However, this configuration of combined bending and twisting may be inconvenient for many applications and therefore it would be desirable to have a piezoelectric beam configuration which would provide pure torsional motion. Even more desirable would be to have a piezoelectric beam configuration which could be switched over the whole range between the provision of pure torsional motion and pure bending motion.

Figure 6A:
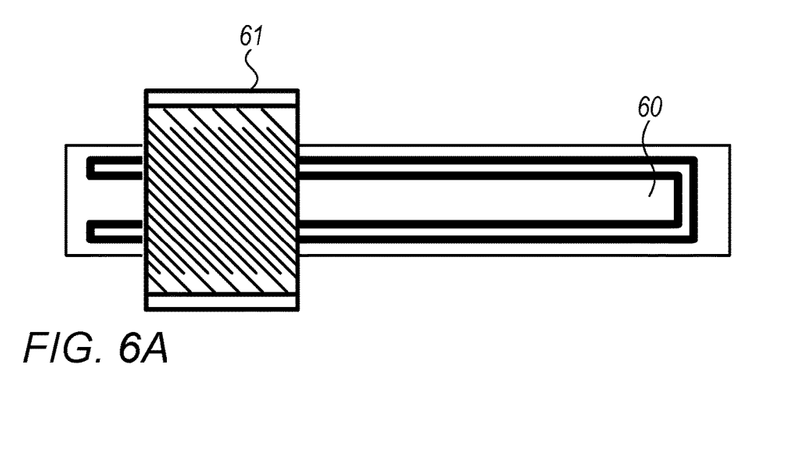
FIGS. 6A to 6C illustrate a novel bulk piezoelectric cantilever beam in which the IDE's are oriented obliquely to the length axis of the beam, on both surfaces of the beam.
Figure 6B:
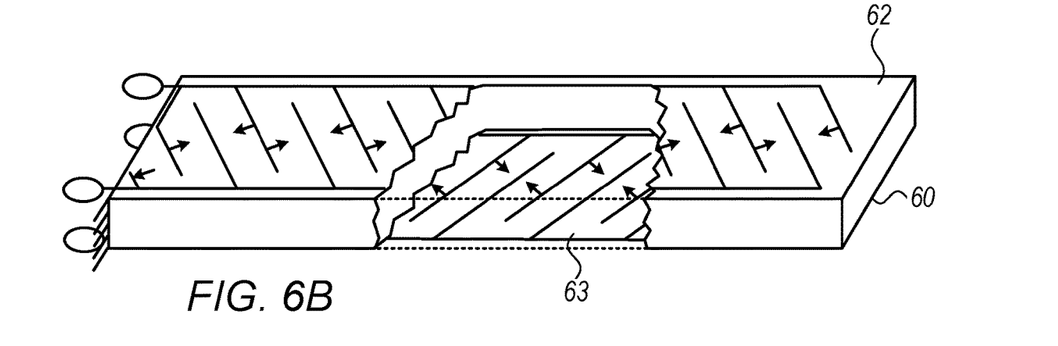
Figure 6C:
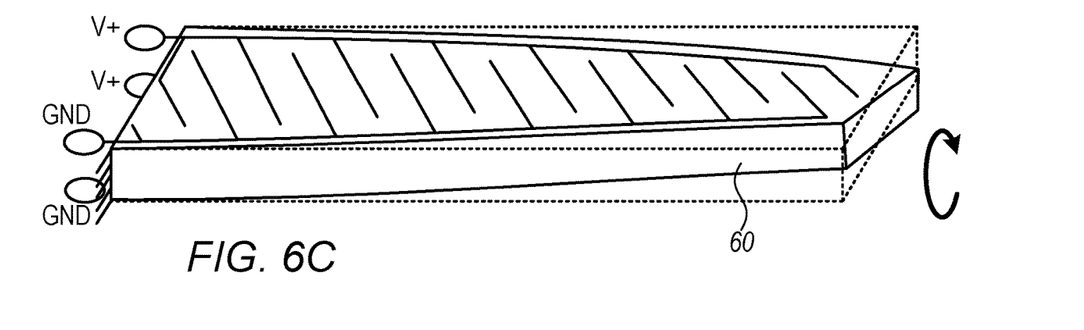

Reference is now made to FIGS. 6A to 6C, which illustrate a novel bulk piezoelectric cantilever beam 60, clamped at its left-hand end in the drawing, and constructed according to the configurations shown in the present disclosure. Like the previous implementation of FIGS. 2A to 2C, the IDE's 61 are oriented obliquely to the length axis of the beam, typically at 45°, but in the implementation shown in FIGS. 6A to 6C, are applied on both surfaces of the beam, the IDE's on the two surfaces being oriented in mutually opposite angles of slant relative to the length axis of the beam. Thus if the IDE's on the top surface are oriented at 45° to the beam axis, the IDE's on the bottom surface are aligned at −45° to the beam axis. As a result, if the same voltage is applied to the top IDE's and the bottom IDE's, a pure torsional motion is generated in the piezoelectric beam, the torsional motion increasing with increased energizing voltage. Alternatively, by reversing the voltage on one of the sets of IDE's, the very same beam actuator can be driven in a pure bending mode. Variation of the ratio between the voltages can provide any combination of twist and bending, within the limits of the capability of the device. FIG. 6A shows a representation of a micrograph of the double-sided IDE beam 60. FIG. 6B is a cut-away representation of the beam showing the relative alignment of the two 45° IDE arrays on the top surface 62, as compared with the bottom surface 63. FIG. 6C is a schematic representation of the device of FIGS. 6A and 6B, showing the torsional motion, as represented by the circular arrow at the right hand side of the beam, generated by applying the voltage V+ to both top and bottom IDE sets.

Figure 7:
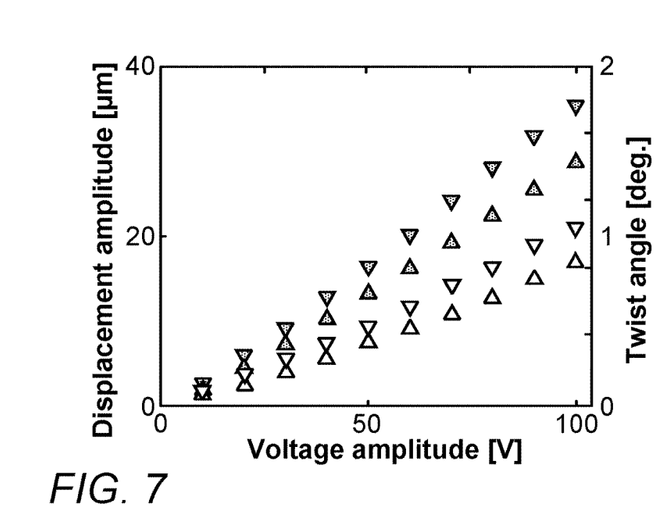
FIG. 7 is a graph showing the displacements and twist angles in the device of FIGS. 6A to 6C, measured at the free edge of the beam when only one set of electrodes is actuated.

Reference is now made to FIGS. 7 to 10, which are graphs showing the performance of the double-sided 45° IDE beam of FIGS. 6A to 6C. FIG. 7 is a graph showing the displacements (left ordinate) and twist angles (right ordinate) measured at the free edge of the beam when only one set of electrodes is actuated, either the top or the bottom set. In the graph of FIG. 7, the beam actuators are driven by a constant DC offset of 50V, and a slow (10 Hz) AC voltage signal, with increasing amplitude of up to Vac=50V, in order to plot the variation of the motions with energizing voltage. The displacements shown in these graphs were measured using a laser vibrometer. The deflections measured at the center of the free edge are the bending amplitudes, marked by an upright (i.e. with vertex at the top of the triangle) shaded triangle for only top-electrode actuation and by an inverted shaded triangle for only bottom-electrode actuation. The twist angles of the free edge are marked by an upright hollow triangle for only top-electrode actuation, and by an inverted hollow triangle for only bottom-electrode actuation. When the beam is driven by only the top or the bottom electrodes, the bending and torsion responses are clearly coupled, reaching 35 µm bending displacement and 1° twist angle at the maximum energizing voltage of 100V amplitude.

Figure 8:
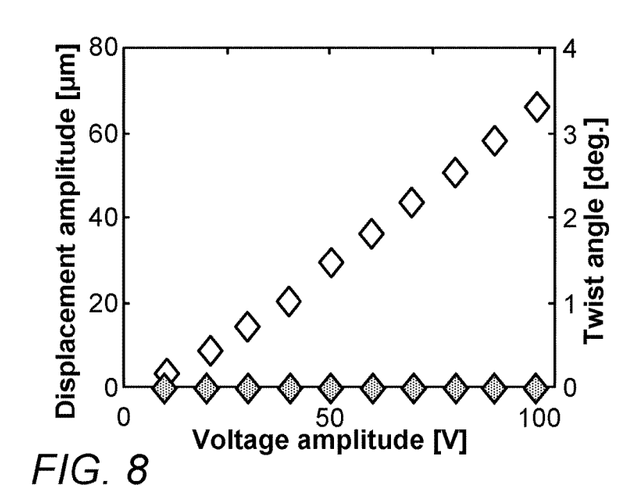
FIG. 8 shows a graph illustrating the generation of a pure torsional motion mode in the device of FIGS. 6A to 6C, when both top and bottom electrodes are actuated with the same voltage signal.

Reference is now made to FIG. 8, which shows a graph illustrating the generation of the pure torsional motion mode, when both top and bottom electrodes are actuated using the same voltage signal. Clearly, the bending displacements as shown by the filled diamonds, are negligible, while at the maximal voltage amplitude of 100V, the twist angle of the beam, as shown by the hollow diamonds, reaches 3.3°.

Figure 9:
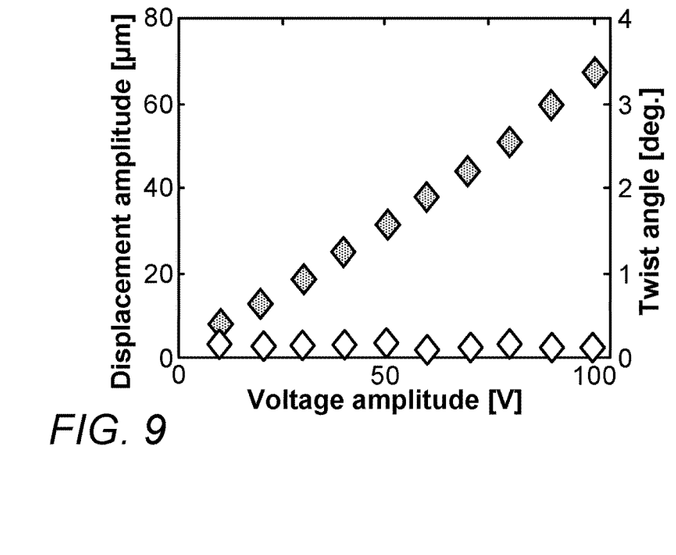
FIG. 9 is a graph showing the generation of a pure bending mode in the device of FIGS. 6A to 6C, where the top and bottom electrodes are subjected to the same voltage signal, but with opposite polarity.

Similarly, reference to FIG. 9 shows the generation of the pure bending mode, where the top and bottom electrodes are subjected to the same voltage signal, but with opposite polarity. Clearly, the twist angles denoted by the hollow diamonds, are essentially negligible, while at the maximal voltage amplitude, 100V, the bending displacement, as denoted by the filled diamonds, reaches 67 µm.

Figure 10:
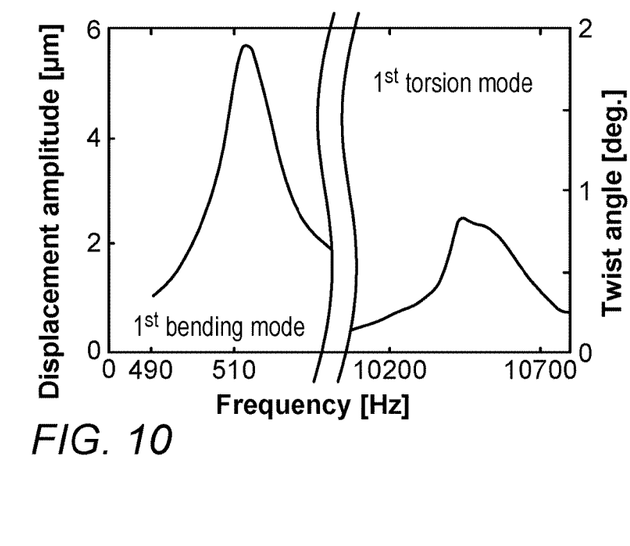
FIG. 10 shows the frequency responses of the device of FIGS. 6A to 6C for bending and torsional vibrating motion.

FIG. 10 shows the frequency response of the device of FIGS. 6A to 6C. The first bending mode resonance frequency is 513 Hz, with a sharpness (quality factor) of 27 at atmospheric pressure, for an AC driving voltage of 1.5 V. The first torsion mode frequency is at 10.4 kHz, with a quality factor of 32. As previously mentioned, the presence of both modes of resonance when the device is excited from one surface only, either because only one surface has an IDE array, or because the device has 2-sided IDE's, but only the IDE's on one surface of the two is activated, essentially does not affect the operation of the device in a resonant mode.

Reference is now made to FIGS. 11 to 14, which illustrate schematically the structure and performance of a piezoelectric device having a central stage supported on a number of spiral piezoelectric arms, which are poled and driven by interdigitated electrodes (IDE's) deposited along the length of each spiral, on one surface of the structure.

Figure 11:
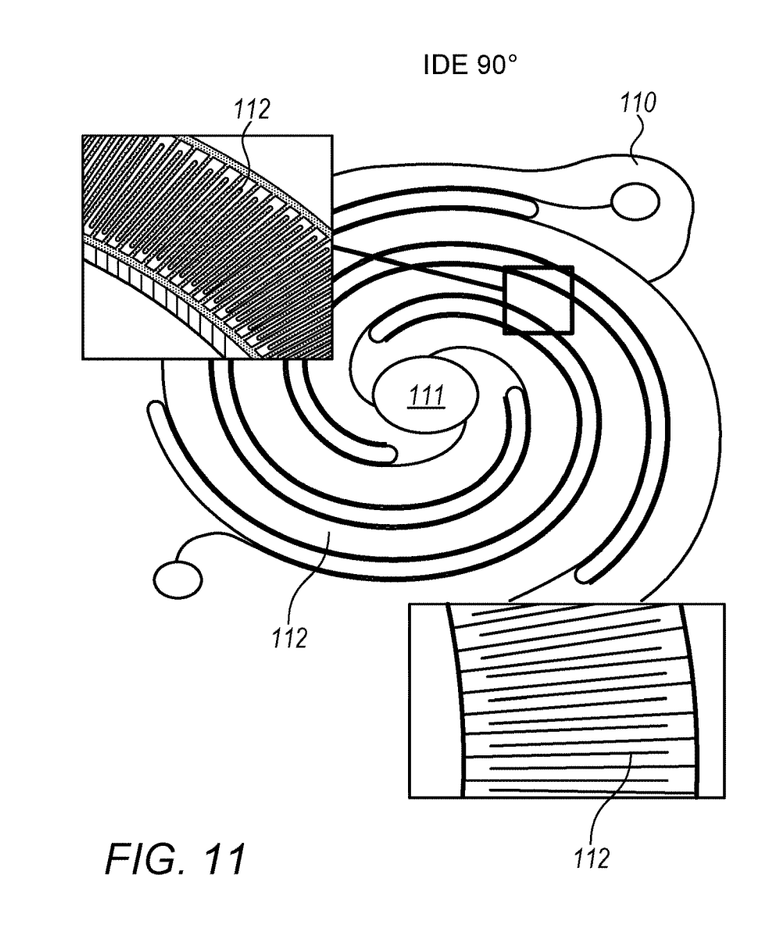
FIG. 11 is a representation of a micro-photograph of an exemplary piezoelectric device, having a central stage suspended on three spiral arms, each spiral arm having an IDE array of electrodes at right angles of the centerline of the spirals.

Reference is first made to FIG. 11, which is a representation of a micro-photograph of an exemplary device constructed on a single 127 µm thick lead zirconate titanate (PZT) plate, having a central stage 111 suspended on three spiral arms 112, whose outer ends are anchored on the PZT base plate 110. Although the devices shown in this implementation have three spiral arms, it is to be understood that this is only a convenient implementation, and that a different number of arms may also be used. The device has a compact geometry. The device illustrated in FIG. 11 has 20 μm wide interdigitated electrodes deposited on one (the top) surface of the spiral arms, with a representation of a micrograph of a part of one of the spiral arms showing this IDE structure 112 at the top left hand side of the drawing. The inset below the drawing shows a schematic representation of the IDE structure, so that its geometry can be discerned clearly. It is to be understood that this is one convenient implementation, and that a different width of electrodes may also be used. These IDEs are used for both poling the PZT and for driving the structure. The structure is intended to achieve parallel out-of-plane motion using the bulk, unimorph piezoelectric actuators. The device IDEs are oriented at 90° relative to the axis running along the center of the spirals, as is conventional in the prior art for IDEs intended to generate motion in an element. They are driven by a DC bias of $V_{dc}$=50V, superposed with a 10 Hz sine-wave of up to Vac=50V.

Figure 13:
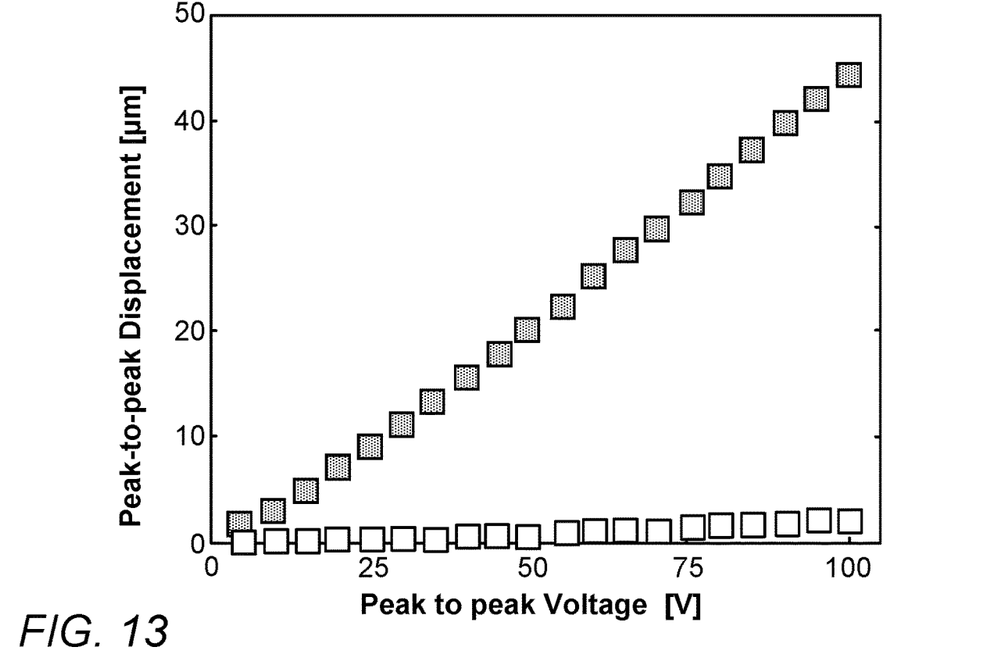
FIG. 13 is a graph of the motion amplitudes of the central stage of the devices of FIGS. 11 and 12 as a function of applied voltage.

Reference is now made to FIG. 13, which is a graph of the motion amplitude of the central stage of, inter alia, the device of FIG. 11, as a function of applied voltage. As shown by the hollow squares plotted in FIG. 13, the motion amplitude of the device of FIG. 11 is very small—up to 2 μm at the maximal voltage amplitude of 100V. The reason for this small plane motion is that with the IDEs at 90° to the line along the central axis of the spiral arms, bending deformation of the spiral arms is induced. Such bending deformation does not enable the central stage to move appreciably. If the spiral arms were constructed of bimorphs, the situation would not have been significantly improved, with the small movement being approximately doubled.

Figure 12:
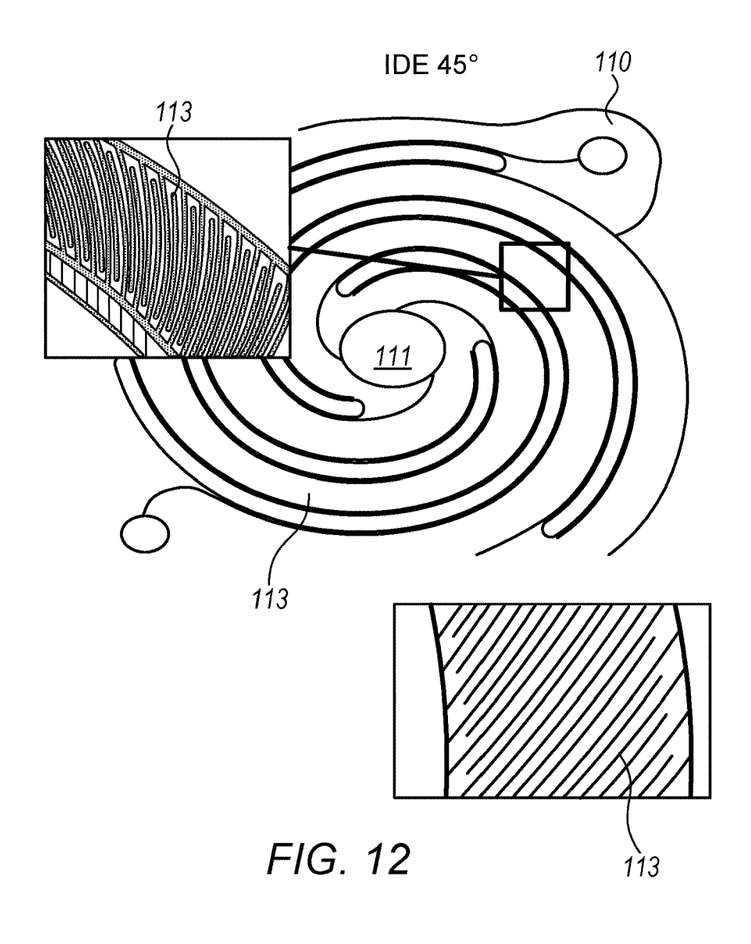
FIG. 12 shows a schematic drawing of a device like that of FIG. 11, but having spiral arms with IDE's oriented at an obliquely directed angle relative to the axis running along the spirals.

Reference is now made to FIG. 12, which shows a device like that of FIG. 11, having spiral arms 113, but which differs from the implementation of FIG. 11 in that the IDEs are oriented at an obliquely directed angle, 45° in the example shown, relative to the axis running along the spirals. This orientation induces torsion in the spiral arms. Application of torsion results in a substantially larger out-of-plane motion of the central stage, than is obtained by application of just bending.

As shown now in the graph of FIG. 13, the motion amplitudes of the central stage in the device of FIG. 12, as shown by the filled squares, are approximately 22 times larger than those of the 90° IDEs of FIG. 11, reaching 44 μm for the same maximal voltage amplitude of 100V. This result shows the surprisingly substantial advantage of torsional deformation over bending deformation for the provision of out-of-plane motion in this spiral application. Though the 45° orientation of the IDEs is chosen to provide the maximum motion of the central plate, it is to be understood that this angle is not unique, and that out-of-plane motion is also generated, but at a lesser level by other angled orientation of the IDEs.

Figure 14:
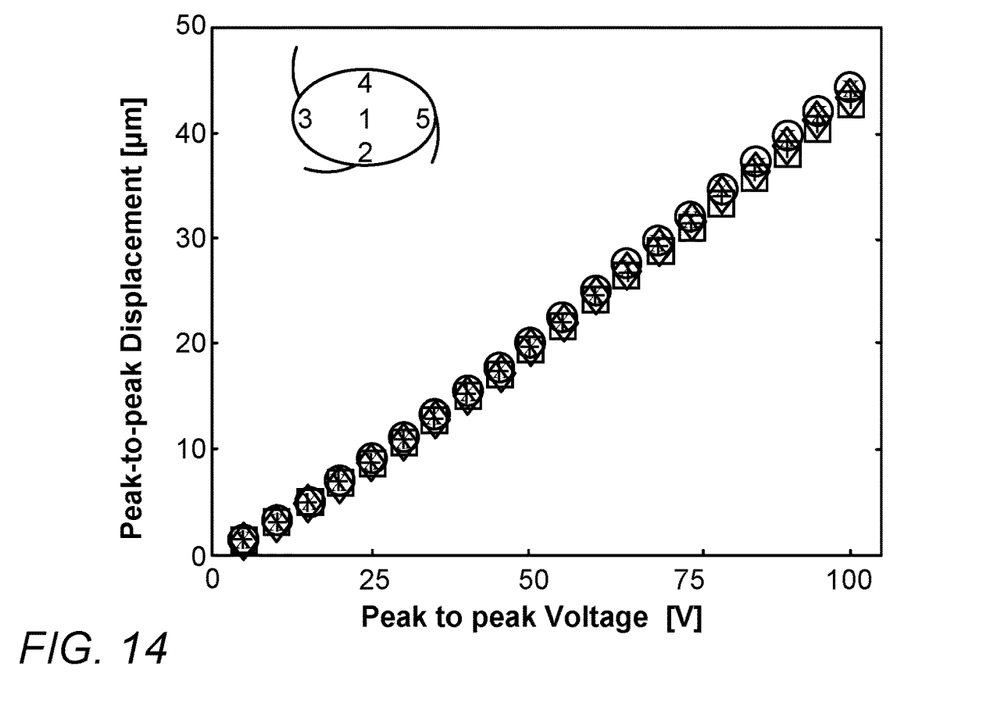
FIG. 14 is a graph showing the out-of-plane displacements as a function of drive voltage at different points on the central stage of the device of FIG. 12.

Reference is now made to FIG. 14, which is a graph showing the out-of-plane displacements as a function of voltage at 5 different points on the central stage 111, as shown by the numbers 1 to 5 on the inset of the graph of FIG. 14. The differences in displacements at the various positions on the central stage are so small that they cannot be clearly shown on a graph the size of that of FIG. 14. The displacements of all of the measurement positions for any given drive voltage, fall essentially on the same point. These results demonstrate that the stage motion is parallel, and that there is no induced tilt angle. A maximal difference of 2% was measured between points 1 and 5 at the maximal applied voltage, and it is believed that even this small difference may not even arise from tilting, but rather from the measurement procedure.

The device has been described hereinabove in a configuration where each set of electrodes on each of the spiral arms are connected to the same voltage source, such that all of the spiral arms move out-of-plane by the same extent, and the central stage therefore moves in a parallel manner out of the plane of the substrate. The connections of the spirals to the voltage source are shown in FIGS. 11 and 12 by the fine lines, leading to the sides of the IDE's on the spirals, and to the electrical contact pads. According to another implementation of these devices, different spiral arm electrode sets can be energized with different voltages, such that each spiral arm undergoes a different level of torsion, and therefore each attempts to raise the central stage by a different amount. As a result, the central stage undergoes an out-of-plane tilted motion relative to the substrate. Selection of the different voltages and of the spiral arm electrode sets to which those voltages are applied, enables achievement of a selected tilt motion of the central stage about any two orthogonal axes. This tilt motion can be generated with or without an accompanying motion in the out-of-plane direction.

It is appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

The invention claimed is:

1. A planar device for generating motion, comprising:
at least one piezoelectric element having an interdigitated electrode structure on each of its two opposite surfaces, each interdigitated electrode structure having interleaved fingers, aligned obliquely to the perpendicular to an axis along a length of said at least one piezoelectric element,
wherein said interleaved fingers of the interdigitated electrodes on each of said two opposite surfaces are oriented at mutually opposite angles relative to the axis along the length of said at least one piezoelectric element.

2. The planar device according to claim 1, wherein said at least one piezoelectric element is a beam, and said axis is a longitudinal axis along a length of the beam.

3. The planar device according to claim 2, wherein application of driving voltages to said interdigitated electrodes on said two opposite surfaces generates beam motion ranging from a substantially pure torsional motion to a substantially pure bending motion, depending on a level and direction of voltages applied to said interdigitated electrodes.

4. The planar device according to claim 3, wherein application of voltages of a same level and polarity to the interdigitated electrodes on said two opposite surfaces, causes said beam to undergo substantially pure torsional motion.

5. The planar device according to claim 3, wherein application of voltages of a same level but of opposite polarity to the interdigitated electrodes on said two opposite surfaces, causes said beam to undergo substantially pure bending motion.

6. The planar device according to claim 3, wherein application of voltages of different levels to the interdigitated electrode on said two opposite surfaces, causes said beam to undergo a combination of torsional and bending motion.

7. The planar device according to claim 1, wherein said at least one piezoelectric element is a spiral shaped element, and said axis is a curved axis along a centerline of said at least one spiral shaped piezoelectric element.

8. The planar device according to claim 7, wherein said device comprises a plurality of said spiral shaped piezoelectric elements, each attached to and radiating out from a central platform.

9. The planar device according to claim 1, wherein said angle is approximately 45°.

10. A planar device for generating out-of-plane motion, comprising:
 a piezoelectric substrate comprising a central region and an outer region;
 a plurality of spiral shaped arms connecting said central region to said outer region of said piezoelectric substrate; and
 a pattern of interdigitated finger electrodes formed on at least one surface of each said plurality of spiral shaped arms, said pattern of interdigitated finger electrodes being generally aligned at an angle substantially distinct from a perpendicular to an axis along a length of said plurality of spiral shaped arms.

11. The planar device according to claim 10, wherein said piezoelectric substrate is sufficiently thin that said central region can move out of a plane of said piezoelectric substrate when a voltage is applied to said pattern of interdigitated finger electrodes.

12. The planar device according to claim 10, wherein said pattern of interdigitated finger electrodes are formed on one surface of said plurality of spiral shaped arms.

13. The planar device according to claim 10, wherein said patterns of interdigitated finger electrodes are formed on both surfaces of said plurality of spiral shaped arms.

14. The planar device according to claim 10, wherein said patterns of interdigitated finger electrodes on all of said plurality of spiral shaped arms are energized with the same voltage, such that said central region of said piezoelectric substrate moves in an out-of-plane motion parallel to a plane of said substrate.

15. The planar device according to claim 10, wherein said patterns of interdigitated finger electrodes on at least one of said plurality of spiral shaped arms is energized with a voltage different from that on any other pattern of interdigitated finger electrodes, such that said central region of said piezoelectric substrate moves in an out-of-plane motion tilted relative to a plane of said piezoelectric substrate.

16. The planar device according to claim 10 wherein said angle distinct from the perpendicular to the axis along the length of said plurality of spiral arms is essentially 45°.

17. The planar device according to claim 10 wherein said plurality of spiral shaped arms are formed by spiral shaped slits extending from spaced-apart positions on the perimeter of said central region to said outer region.

18. A planar device for generating a combination of torsional and bending motion in a beam, said planar device comprising a piezoelectric beam having an interdigitated electrode structure with interleaved finger electrodes formed on at least one surface of said beam, said interdigitated electrode structure having its interleaved fingers aligned at an angle substantially divergent from a normal to the centerline along a length of said beam.

19. The planar device according to claim 18 wherein said angle is approximately 45°.

* * * * *